(12) United States Patent
Dietterle et al.

(10) Patent No.: US 7,179,362 B2
(45) Date of Patent: Feb. 20, 2007

(54) ELECTROLYTE AND METHOD FOR DEPOSITING TIN-COPPER ALLOY LAYERS

(75) Inventors: Michael Dietterle, Aalen (DE); Manfred Jordan, Salach (DE); Gernot Strube, Geislingen (DE)

(73) Assignee: Dr.-Ing. Max Schlotter GmbH & Co.KG, Geislingen (DE)

( * ) Notice: Subject to any disclaimer, the term of this patent is extended or adjusted under 35 U.S.C. 154(b) by 269 days.

(21) Appl. No.: 10/380,842

(22) PCT Filed: Sep. 20, 2001

(86) PCT No.: PCT/EP01/10907

§ 371 (c)(1),
(2), (4) Date: Sep. 5, 2003

(87) PCT Pub. No.: WO02/24979

PCT Pub. Date: Mar. 28, 2002

(65) Prior Publication Data

US 2004/0035714 A1 Feb. 26, 2004

(30) Foreign Application Priority Data

Sep. 20, 2000 (DE) ................. 100 46 600
Nov. 29, 2000 (DE) ................. 100 59 139

(51) Int. Cl.
*C25D 3/58* (2006.01)
*C25D 3/60* (2006.01)

(52) U.S. Cl. .................................... 205/241

(58) Field of Classification Search ................ 205/241
See application file for complete search history.

(56) References Cited

U.S. PATENT DOCUMENTS

| 4,244,791 A | * | 1/1981 | Paulet et al. ............... 205/303 |
| 4,389,286 A | | 6/1983 | McCoy |
| 4,490,220 A | | 12/1984 | Houman |
| 4,555,315 A | | 11/1985 | Barbieri et al. |
| 5,417,841 A | | 5/1995 | Frisby |
| 5,863,410 A | | 1/1999 | Yates et al. |
| 6,372,117 B1 | * | 4/2002 | Tamura ...................... 205/241 |
| 6,508,927 B2 | * | 1/2003 | Yanada et al. .............. 205/241 |

FOREIGN PATENT DOCUMENTS

| DE | 29 21 241 A1 | 10/1980 |
| DE | 43 38 148 A1 | 5/1995 |
| DE | 198 52 219 C1 | 5/2000 |
| EP | 0 854 206 A1 | 7/1998 |
| JP | 08013185 | 1/1996 |
| JP | 2000-328286 | 11/2000 |
| JP | 2001-164396 | 6/2001 |
| JP | 2001-234387 | 8/2001 |

OTHER PUBLICATIONS

"*Study of Tin Whiskers on Electromagnetic Relay Parts*", (1978), Yoshikatsu Hada, et al., 15 pages.
"*The Challenge of a Lead-Free Finish for Semiconductor Pins*" (1997), Duane W. Endicott, et al., pp. 50-54.
"*Control of Tin-Lead Alloy Plating Solutions*" (1983) James P. Langon, pp. 21-23.
"*Studies of the Reducing Action of Mercury*" (1936) W. M. Murray, et al., pp. 1843-1847.

* cited by examiner

*Primary Examiner*—Roy King
*Assistant Examiner*—William T. Leader
(74) *Attorney, Agent, or Firm*—Scully, Scott, Murphy & Presser, PC

(57) ABSTRACT

The invention relates to an acid electrolyte for depositing tin-copper alloys. Said electrolyte comprises one or more alkylsulfonic acids and/or alkanolsulfonic acids, one or more soluble tin(II) salts, one or more soluble copper(II) salts, and one or more organic sulfur compounds having one or more thioether functions and/or ether functions of general formula —R—Z—R'—(R and R' are the same or different non-aromatic organic radicals, and Z represents S or O). The invention also relates to a method, which involves the use of the electrolyte, to the coating obtained using said method, and to the use of the electrolyte for coating electronic components.

11 Claims, No Drawings

ELECTROLYTE AND METHOD FOR DEPOSITING TIN-COPPER ALLOY LAYERS

The present invention relates to an acid electrolyte for depositing tin-copper alloys, a method using these electrolytes, coatings obtained using the method and the use of the electrolytes for coating electronic components.

When manufacturing electronic components, soft soldering using the eutectic soldering alloy SnPb (63 wt-% Sn, 37 wt-% Pb) is the standard method of joining technology. Accordingly, it is common to provide these with a lead-tin layer by means of galvanisation processes to obtain solderability of the components to be joined. The lead-tin layers can, in principle, have any alloy composition, pure metals can also be used. Alloys having 3 to 40 wt-% Pb, in particular 5 to 20 wt-% Pb, are used most often. Alloys containing high amounts of lead, e.g. 95% Pb, are employed for special uses if higher melting points are required. Coatings with pure tin are also widely known although there are basic problems here owing to the risk of whisker formations which cannot be ruled out.

Even though the cited lead-tin alloys show very good properties when soft-soldering, great efforts are made to substitute lead. When scrapping and disposing of pieces of equipment having soldered joints containing lead, there is a danger that lead can be converted into a water soluble form by means of corrosive processes. This can thereby lead in the long run to a corresponding contamination of groundwater.

A promising alternative to the eutectic lead-tin solder is the tin-silver-copper alloy. The eutectic composition is also used appropriately here since this allows the processing temperatures to be reduced to a minimum. Processing temperatures which are too high can lead to irreversible damage, for example when soft-soldering circuit boards and parts of electronic components. The eutectic composition of the tin-silver-copper alloy consists of 95.5 wt-% tin, 3.8 wt-% silver and 0.7 wt-% copper. The melting point of the eutectic is 217° C.

If the tin-silver-copper solder is used, it is desirable for the components to be galvanically coated with layers of one or more components of the solder in order to obtain solderability. A coating with pure tin is less desirable owing to the danger of whisker formations as already mentioned above. Coatings with pure silver and tin-silver alloy coatings can be disadvantageous on the grounds of cost. Coatings of pure copper are not suitable since the behaviour of the solder is greatly affected by the formation of an oxide layer on the surface of the copper ("tarnishing"). The use of a tin-copper coating would therefore be desirable. The amount of copper in the tin-copper coating should preferably not essentially differ from the amount of copper in the eutectic alloy in order to allow solderability of the coating at the lowest temperatures possible.

A further promising alternative to the eutectic lead-tin solder is the tin-copper alloy. The eutectic composition is again also used appropriately here since this allows the processing temperatures to be reduced to a minimum. The eutectic composition of the tin-copper alloy consists of 99.3 wt-% Sn and 0.7 wt-% Cu. In addition to the eutectic composition, tin-copper alloys having a somewhat higher copper content (e.g. 3 wt-% copper) can also be used since a higher amount of copper can cause a reduction in whisker formation.

If a tin-copper solder is used, it is again desirable for the components to be connected to be galvanically coated with layers of a tin-copper alloy to obtain solderability.

The electrolytic depositing of copper-tin alloys having copper amounts of approximately 80–90 wt-% (reddish bronze) or 45–60 wt-% Cu (speculum) is known in practice. These alloys are deposited from alkaline solutions containing tin as a stannate and copper in the form of the cyanide complex $Cu(CN)_2^{(-)}$.

Alkaline electrolytes have the disadvantage that the tin is present as a stannate in an alkaline environment, i.e. in a tetravalent form. The depositing speed is thereby reduced by 50% in comparison with an acid electrolyte containing Sn (II).

Furthermore, the use of the highly toxic copper cyanide complex presents a danger for the personal working with the alkaline electrolytes. Furthermore, to prevent environmental damage, the waste water of such electrolytes must be subjected to extensive treatment to remove the cyanide ions.

Furthermore, it should also be possible to use existing systems to deposit tin-copper coatings, which have hitherto been used for coating with tin-lead alloys of acid electrolytes. Since alkaline electrolytes can attack, for example, ceramic parts of components of the existing systems, the use of an acid tin-copper electrolyte is desired.

It is thus preferred for these reasons if the electrolytic depositing of tin-copper alloys can occur from acid electrolytes which contain divalent tin and no cyanide.

Divalent tin can be oxidised into the tetravalent form very easily in acid electrolytes. In this form, the tin can no longer be electrolytically deposited from acid electrolytes and is therefore removed from the process. Oxidation to the tetravalent form is furthermore linked with the formation of large amounts of sludge which can make the practical use of such electrolytes more difficult.

For this reason, it is common in the prior art to add suitable oxidation stabilisers to prevent oxidation of the divalent tin ions. Typical compounds are, for example monohydroxyphenyl or polyhydroxyphenyl compounds such as catechol, hydroquinone or phenyl sulfonic acid. These compounds are described in detail in the pertinent literature (for example, Manfred Jordan: Die elektrolytische Abscheidung von Zinn und Zinnlegierungen, Eugen G. Leuze-Verlag 1993, page 83).

The oxidation of tin (II) is catalytically accelerated by means of copper ions. The divalent tin can reduce copper into monovalent copper. The monovalent copper is reoxidised to the divalent form again by means of atmospheric oxygen. Hydrogen peroxide is thereby formed as an intermediate product. The following reaction equations show the cited reaction:

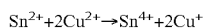

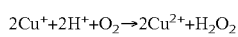

This reaction mechanism is described by W. M. Murray and N. H. Furman (J. Am. Chem. Soc. 58 (1936) 1843).

Copper concentrations of up to 5 g/l, depending on the tin content of the electrolyte, are required for depositing tin-copper alloys having a copper proportion of up to 10 wt.-%. These high concentrations of copper cause such high oxidation rates of the divalent tin that there is no stable operation of the acid electrolyte. Oxidation of the tin (II) cannot be prevented in the presence of copper even by adding higher amounts of the antioxidants known from the prior art.

A further problem when developing an acid electrolyte for depositing tin-copper alloys having a low proportion of copper is the relatively large potential difference between the metals tin and copper. The standard potentials are:

$Sn^{2+} + 2e \rightarrow Sn^0: -0.12$ V $Cu^{2+} + 2e \rightarrow Cu^0: +0.35$ V If the potential difference of the two metals is large in an electrolyte containing two depositable metals, the metal having the more positive standard potential is preferably deposited. This means that copper is preferably deposited from a tin-copper electrolyte.

Furthermore, during the charge exchange, the potential difference causes the electrochemically more noble component copper to be deposited on the tin anodes generally used in the method for electrolytically depositing tin alloys. The tin anodes can be passivated by means of this reaction. Such passivated tin anodes no longer allow a passage of current and prevent electrolytic metal depositing.

The depositing of copper on the anodes furthermore leads to a decrease in the concentration of the copper ions in the electrolyte. However, in order to obtain a coating having a specific copper content, the concentration of copper ions in the electrolyte should remain as constant as possible.

To successfully deposit tin-copper alloys having a specific copper content from an acid electrolyte containing divalent tin ions, it is thus necessary to find suitable compounds which cause a complexing of the copper, thereby shifting the standard potential of the copper to more negative values so that the desired concentration of copper ions in the electrolyte can be maintained. Furthermore, the complexing agents must act selectively on copper. If a complexing of tin takes place at the same time, a shift in the standard potential thereof to more negative values would also occur here. The original potential difference of the non-complexed ions would thus be restored.

The object of the present invention is thus to provide an electrolyte for depositing tin-copper alloys, which is suitable for use in existing systems which have hitherto been used for depositing standard lead-tin layers, which does not cause a passivation of the anodes by depositing copper on the anodes, and with which tin-copper coatings of a desired composition can be obtained.

The electrolyte should furthermore be stable with regard to the oxidation of the tin (II) ions catalysed by the copper (II) ions and with regard to the formation of sludge so that an electrolyte which can be used over a long period of time is obtained. It should be possible to use said electrolyte at both low cathodic current densities (barrel or rack method) and at high cathodic current densities (continuous galvanisation method), with the electrolyte also being non-toxic and in particular not complicating waste water treatment, i.e. it should have no impact on the environment.

The object is solved by means of an acid, aqueous electrolyte for depositing tin-copper alloys, comprising one or more alkylsulfonic acids or alkanolsulfonic acids, one or more soluble tin (II) salts, one or more soluble copper (II) salts, and one or more organic sulfur compounds, with the organic sulfur compounds comprising one or more thioether functions and/or ether functions of the general formula —R—Z—R'— as structural features, wherein R and R' are the same or different non-aromatic organic radicals and Z represents a sulfur atom or an oxygen atom on the condition that at least one of the radicals R and R' comprises at least one sulfur atom if Z is exclusively an oxygen atom.

The organic sulfur compounds preferably have the following general formula:

$$X—R^1—[Z—R^2]_n—Z—R^3—Y \quad (I)$$

wherein n=0 to 20, preferably 0 to 10, particularly preferred 0 to 5, X and Y each independently represent —OH, —SH, or —H, Z is a sulfur atom or an oxygen atom and the radicals Z are each the same or different if $n \geq 1$ in formula (I), $R^1, R^2$ and $R^3$ each independently represent a substituted linear or branched alkylene group and the radicals $R^2$ are each the same or different if n>1 in formula (I). This is on the condition that at least one of the radicals X, Y, $R^1, R^2$ and $R^3$ contains at least one sulfur atom if Z is exclusively an oxygen atom.

Examples of alkylene groups are alkylene groups having 1 to 10, preferably 1 to 5, carbon atoms, e.g. methylene, ethylene, n-propylene, isopropylene, n-butylene, isobutylene and tertbutylene groups. Examples of substituents of the alkylene groups are —OH, —SH, —SR$^4$, with R$^4$ being an alkyl group having 1 to 10 carbon atoms, e.g. a methyl, ethyl, n-propyl or isopropyl group, —OR$^4$, —NH2, NHR$^4$ NR$^4_2$ (wherein the two substituents R$^4$ can be the same or different).

If Z solely represents an oxygen atom in formula (I), the sulfur containing radicals X and/or Y can be an SH group and/or the sulfur containing radicals $R^1, R^2$ and/or $R^3$ can, for example, represent an alkylene radical substituted with an SH group or an SR$^4$ group.

In formula (I) $n \geq 1$, $R^1$, $R^2$ and $R^3$ preferably each independently represent an alkylene group having at least two carbon atoms, and if only one Z represents a sulfur atom, X and/or Y is an SH group, and if Z is exclusively an oxygen atom, X and Y both represent an SH group.

Furthermore, the following organic sulfur compounds are preferred:
Bis-(hydroxyethyl)-sulfide:
HO—CH$_2$—CH$_2$—S—CH$_2$—CH$_2$—OH
3,6-dithiaoctanediol-1,8:
HO—CH$_2$—CH$_2$—S—CH$_2$—CH$_2$—S—CH$_2$—CH$_2$—OH
3,6-dioxaoctanedithiol-1,8:
HS—CH$_2$—CH$_2$—O—CH$_2$—CH$_2$—O—CH$_2$—CH$_2$—SH
3,6-dithia-1,8-dimethyloctanediol-1,8:
HO—CH(CH$_3$)—CH$_2$—S—CH$_2$—CH$_2$—S—CH$_2$—CH(CH$_3$)—OH
4,7-dithiadecane:
H$_3$C—CH$_2$—CH$_2$—S—CH$_2$—CH$_2$—S—CH$_2$—CH$_2$—CH$_3$
3,6-dithiaoctane:
H$_3$C—CH$_2$—S—CH$_2$—CH$_2$—S—CH$_2$—CH$_3$
3,6-dithiaoctanedithiol-1,8:
HS—CH$_2$—CH$_2$—S—CH$_2$—CH$_2$—S—CH$_2$—CH$_2$—SH The molar ratio of the organic sulfur compound to the soluble copper (II) salt (molecular amount of organic sulfur compound: molecular amount of soluble copper (II) salt) is preferably at least 2:1, particularly preferred at least 3:1, especially preferred 20:1 to 3:1.

The tin (II) can be present in the electrolyte as the salt of inorganic, alkylsulfonic or alkanolsulfonic acids. Examples of salts of inorganic acids are sulfates and tetrafluoroborates. Preferred salts of alkylsulfonic acids are, for example, methanesulfonates, ethanesulfonates, n- and isopropanesulfonates, methanedisulfonates, ethanedisulfoiates, 2,3-propanedisulfonates and 1,3-propanedisulfonates. Alkanolsulfonates which can be used are 2-hydroxyethanesulfonates, 2-hydroxypropanesulfonates and 3-hydroxypropanesulfonates. Tin (II) methanesulfonate is particularly preferred.

The tin (II) salts are present in the electrolyte preferably in an amount of 5 to 200 g/l electrolyte, particularly preferred 10 to 100 g/l electrolyte, calculated as tin (II).

The copper (II) is present in the electrolyte preferably in the form of salts of inorganic, alkylsulfonic or alkanolsulfonic acids. Examples of salts of inorganic, alkylsulfonic or alkanolsulfonic acids correspond to those compounds specified above for the tin (II) salts. Copper (II) methanesulfonate is particularly preferred.

Preferably 0.05 to 50 g/l electrolyte, particularly preferred 0.1 to 20 g/l electrolyte, of copper (II) salts, calculated as copper (II), are present in the electrolyte.

The soluble copper salts can be produced when preparing the electrolyte by adding copper compounds which dissolve in the acidic range to form salts. Examples of copper compounds which dissolve in the acidic range to form salts are copper oxide (CuO), copper carbonate ($CuCO_3$) and soluble copper carbonate ($Cu_2(OH)_2 CO_3$).

Common antioxidants, for example, monohydroxyphenyl or polyhydroxyphenyl compounds such as catechol, hydroquinone or phenyl sulfonic acids can be present in the electrolyte. The concentration of this antioxidant can be 0.05 to 10 g/l electrolyte.

The electrolyte can furthermore contain different additions which are commonly used in acid electrolytes for depositing tin alloys, e.g. grain refining additions, surface-active agents, and/or brightening agents.

Non-ionic surfactants having the general formula RO—$(CH_2$—$CH_2$—$O)_n$—H, wherein R represents an alkyl, aryl, alkaryl or aralkyl group having 1 to 20, preferably 1 to 15, carbon atoms, and n=1 to 20, can, for example, be present as the grain refining addition.

The grain refining addition is present preferably in an amount of 0.1 to 50 g/l electrolyte, particularly preferred 1 to 10 g/l electrolyte.

The surface-active agents can be present in an amount of 0.1 to 50 g/l electrolyte, preferably 0.5 to 10 g/l electrolyte.

The alkylsulfonic and alkanolsulfonic acids preferably have 1 to 10, particularly preferred 1 to 5, carbon atoms. Methanesulfonic acid, ethanesulfonic acid, n-propanesulfonic acid, isopropanesulfonic acid, methanedisulfonic acid, ethanedisulfonic acid, 2,3-propane-disulfonic acid or 1,3-propanedisulfonic acid, for example, can be used as alkylsulfonic acids. Alkanolsulfonic acids which can be used are, for example, 2-hydroxyethanesulfonic acid, 2-hydroxypropanesulfonic acid and 3-hydroxypropanesulfonic acid.

The alkylsulfonic and/or alkanolsulfonic acids are present in the electrolyte preferably at a concentration of 50 to 300 g/l electrolyte, particularly preferred 100 to 200 g/l electrolyte.

The pH of the acidic electrolyte is preferably 0 to <1.

A method for the electrolytic coating of substrates with tin-copper alloys, in which the coating is applied by conducting through direct current using the electrolyte according to the invention, a metallic tin anode and a cathode of the substrate to be coated, is furthermore provided by the present invention.

The tin-copper alloys applied using this method can contain copper in an amount of 0.1 to 99.9 wt-%. To allow the alloys to be soldered at low temperatures, they preferably comprise a copper content of 0.5 to 10 wt-%, particularly preferred 2 to 5 wt-%. The copper content can be adjusted, for example, by varying the concentration ratios of the tin and copper salts in the electrolyte, the temperature of the electrolyte and the flow rate of the electrolyte based on the material to be coated.

The current density can be between 0.1 $A/dm^2$ (barrel or rack method) and 100 $A/dm^2$ (high-speed systems).

The temperature of the electrolyte lies preferably within the range of 0 to 70° C., particularly preferred within the range of 20 to 50° C.

All common materials used for the production of electronic components can be present as the substrate to be coated. Examples hereof are copper or copper alloys, nickel-iron alloys (e.g. alloy 42), nickel-plated surfaces and similar materials.

The electrolyte according to the invention can be used for coating electronic components.

The present invention is explained by means of the following embodiment examples.

EXAMPLE 1

A tin-copper electrolyte was prepared as follows:

| | |
|---|---|
| 150 g/l | 70% aqueous methanesulfonic acid |
| 20 g/l | Tin (II) as tin methanesulfonate |
| 0.5 g/l | Copper (II) as copper methanesulfonate |
| 6 g/l | 3,6-dithiaoctanediol-1,8 |
| 4 g/l | Nonylphenolethoxilate with 14 EO groups (Lutensol AP-14 of the firm BASF) |

Copper sheets were coated with this electrolyte using the rack method at a current density of 0.5 to 2 $A/dm^2$. The temperature of the electrolyte was 20±2° C. The electrolyte had a pH of 0. Fine-crystalline, light, glossy layers showing no sign of dendritic formation were obtained.

EXAMPLE 2

The following tin-copper electrolyte was prepared:

| | |
|---|---|
| 150 g/l | 70% aqueous methanesulfonic acid |
| 40 g/l | Tin (II) as tin methanesulfonate |
| 1 g/l | Copper (II) as copper methanesulfonate |
| 12 g/l | 3,6-dithiaoctanediol-1,8 |
| 4 g/l | Bisphenol-A-Ethoxilate (Lutron HF-3 of the firm BASF) |

The depositing of the tin-copper coating from this electrolyte on a copper sheet was carried out at 40±2° C. in a high-speed system at a current density range of 5 to 20 $A/dm^2$. The electrolyte was stirred intensively (magnet stirrer, 40 mm stirring rod, stirring speed 700 Upm). Light gray, semi-gloss (matt) deposits were obtained.

EXAMPLE 3

The following tin-copper electrolyte was prepared:

| | |
|---|---|
| 150 g/l | 70% aqueous methanesulfonic acid |
| 20 g/l | Tin (II) as tin methanesulfonate |
| 0.5 g/l | Copper (II) as copper methanesulfonate |
| 6 g/l | 3,6-dithiaoctanediol-1,8 |

500 g of metallic tin pieces were added to the electrolyte having a pH of 0 so that the surface charge was 2 $dm^2$/l. Following a standing time of 24 hours at room temperature (25° C.), the decrease in the dissolved copper in the sample was determined by means of ICP emission spectrometry (ICP=inductively coupled plasma). This decrease is a measurement of the reduction in the concentration of copper in the electrolyte owing to deposition on the tin (deposition during the charge exchange).

The concentration was reduced by 2 mg/l copper which corresponds to a decrease of 0.4%.

COMPARATIVE EXAMPLE 1

The same electrolyte as the one in example 3 was prepared with the exception that no 3,6-dithiaoctanediol-1,8 was added. The same amount of metallic tin pieces as in example 3 were added so that a surface charge of 2 dm²/l resulted again. A measurement of the copper concentration by means of ICP emission spectrometry after a standing time of 24 hours at room temperature (25° C.) revealed a reduction in the copper content by 111 mg/l which corresponds to a decrease of 22%.

A comparison of Example 3 and Comparative Example 1 clearly shows that the use of the organic sulfur compounds according to the invention prevents a depositing of copper on the tin anodes during the charge exchange and keeps the copper concentration in the electrolyte constant.

EXAMPLE 4

The following tin-copper electrolyte was prepared:

| | |
|---|---|
| 150 g/l | Methanesulfonic acid (70 wt. %) |
| 38.5 g/l | Tin (II) as tin (II) methanesulfonate |
| 1 g/l | Copper (II) as copper (II) methanesulfonate |
| 10 g/l | 3,6-dithiaoctanediol-1,8 |
| 1 g/l | Catechol |

A flow of oxygen of 80 l/h was conducted through a volume of 1 l of the cited electrolyte for a period of 7 hours at 50° C. The following change in the concentration of tin (II) was measured:

| | | |
|---|---|---|
| (1) | Initial state: | 38.5 g/l Sn (II) |
| (2) | After 7 hours of oxygen introduction: | 35.6 g/l Sn (II) |
| | Appearance of the solution: yellow, clear | |

EXAMPLE 5

The following tin-copper electrolyte was prepared:

| | |
|---|---|
| 150 g/l | Methanesulfonic acid (70 wt. %) |
| 36.8 g/l | Tin (II) as tin (II) methanesulfonate |
| 1 g/l | Copper (II) as copper (II) methanesulfonate |
| 10 g/l | 3,6-dithiaoctanediol-1,8 |
| 1 g/l | Catechol |

A flow of oxygen of 80 l/h was conducted through a volume of 1 l of the cited electrolyte for a period of 7 hours at 50° C. The following change in the concentration of tin (II) was measured:

| | | |
|---|---|---|
| (1) | Initial state: | 36.8 g/l Sn (II) |
| (2) | After 7 hours of oxygen introduction: | 35.1 g/l Sn (II) |
| | Appearance of the solution: yellow, clear | |

The values obtained show that the oxidation of the divalent tin is greatly reduced in the electrolyte according to the invention.

COMPARATIVE EXAMPLE 2

The experiment according to Example 1 was repeated without the addition of 3,6-dithiaoctanediol-1,8. The following change in the concentration of tin (II) was measured:

| | | |
|---|---|---|
| (1) | Initial state: | 38.5 g/l Sn (II) |
| (2) | After 7 hours of oxygen introduction: | 23.2 g/l Sn (II) |
| | Appearance of the solution: cloudy with a large formation of sludge. | |

COMPARATIVE EXAMPLE 3

The following electrolyte was prepared in order to examine whether the oxidation of tin (II) can be prevented by increasing the concentration of the antioxidants known from the prior art:

| | |
|---|---|
| 150 g/l | Methanesulfonic acid (70 wt. %) |
| 38.5 g/l | Tin (II) as tin (II) methanesulfonate |
| 1 g/l | Copper (II) as copper (II) methanesulfonate |
| 7 g/l | Catechol |

The following change in the concentration of tin (II) was measured:

| | | |
|---|---|---|
| (1) | Initial state: | 38.5 g/l Sn (II) |
| (2) | After 7 hours of oxygen introduction: | 24.5 g/l Sn (II) |
| | Appearance of the solution: cloudy with a large formation of sludge. | |

The values obtained show that the oxidation of tin (II) in the presence of copper ions cannot be prevented by increasing the concentration of the antioxidant according to the prior art to an amount seven times greater than the amount normally used.

The invention claimed is:

1. An acidic, aqueous electrolyte for depositing tin-copper alloys comprising
   one or more alkylsulfonic acids and/or alkanolsulfonic acids,
   one or more soluble tin (II) salts,
   one or more soluble copper (II) salts, and
   one or more organic sulfur compounds,
   characterized in that the organic sulfur compounds comprise one or more thioether functions and/or ether functions of the general formula —R—Z—R'-as structural features, with Z representing a sulfur atom or an oxygen atom, and R and R' being the same or different non-aromatic organic radicals on the condition that at least one of the radicals R and R' comprises at least one sulfur atom if Z is exclusively an oxygen atom and said tin-copper alloy comprises copper in an amount of 0.1 to 99.9 wt-%.

2. An electrolyte according to claim 1, characterized in that the organic sulfur compounds have the following general formula:

$$X-R^1-[Z-R^2]_n-Z-R^3-Y \quad (I)$$

wherein n=0 to 20, X and Y each independently represent —OH, —SH, or —H, Z is a sulfur atom or an oxygen atom and the radicals Z are the same or different if n≧1 $R^1$, $R^2$ and $R^3$ each independently represent a substituted linear or branched alkylene group and the radicals $R^2$ are the same or different if n>1 on the condition that at least one of the radicals X, Y, $R^1$, $R^2$ and $R^3$ contains at least one sulfur atom if Z is exclusively an oxygen atom.

3. An electrolyte according to claim 2, characterized in that n is≧1, $R^1$, $R^2$ and $R^3$ independently represent an alkylene group having at least two carbon atoms, and if only one Z represents a sulfur atom, X and/or Y represent —SH, and if Z is exclusively an oxygen atom, X and Y are both —SH.

4. An electrolyte according to claim 1, characterized in that the molar ratio of the one or more organic sulfur compounds to the one or more soluble cooper (II) salts (molecular amount of organic sulfur compound:molecular amount of soluble cooper (II) salt) is at least 2:1.

5. An electrolyte according to claim 1, characterized in that the tin (II) salts are salts of inorganic, alkylsulfonic or alkanolsulfonic acids.

6. An electrolyte according to claim 1, characterized in that the copper (II) salts are salts of inorganic, alkylsulfonic or alkanolsulfonic acids.

7. An electrolyte according to claim 1, characterized in that a grain refining addition is contained.

8. An electrolyte according to claim 7, characterized in that non-ionic surfactants having the general formula RO—$(CH_2CH_2—O)_n$—H, wherein R represents an alkyl, aryl, alkaryl or aralkyl group and n=1 to 20, are present as the grain refining addition.

9. Method for the electrolytic coating of substrates using tin-copper alloys, characterized in that coating is carried out by conducting through direct current using an electrolyte according to claim 1, a metallic tin anode and a cathode made of the substrate to be coated.

10. An electrolyte according to claim 1, wherein said tin-copper alloy comprises copper in an amount of 0.5 to 10 wt-%.

11. An electrolyte according to claim 1, wherein said tin-copper alloy comprises copper in an amount of 2 to 5 wt-%.

* * * * *